(12) United States Patent
Min

(10) Patent No.: US 8,705,295 B2
(45) Date of Patent: Apr. 22, 2014

(54) SEMICONDUCTOR MEMORY SYSTEM AND METHOD FOR DRIVING THE SAME

(75) Inventor: Min Min, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 107 days.

(21) Appl. No.: 13/288,284

(22) Filed: Nov. 3, 2011

(65) Prior Publication Data

US 2012/0275241 A1   Nov. 1, 2012

(30) Foreign Application Priority Data

Apr. 29, 2011   (KR) .................. 10-2011-0040803

(51) Int. Cl.
  *G11C 7/06*   (2006.01)
(52) U.S. Cl.
  USPC ............................... 365/189.07; 365/185.11

(58) Field of Classification Search
  USPC ........................... 365/189.07, 185.11, 185.29
  See application file for complete search history.

(56) References Cited

U.S. PATENT DOCUMENTS 6,456,530 B1 *   9/2002   Micheloni et al. ........ 365/185.13

FOREIGN PATENT DOCUMENTS

KR   1020110014923   2/2011

* cited by examiner

*Primary Examiner* — Huan Hoang
(74) *Attorney, Agent, or Firm* — IP & T Group LLP

(57) ABSTRACT

A method for driving a semiconductor memory device includes controlling a plurality of erase voltages for a plurality of memory blocks, respectively, comparing the plurality of controlled erase voltages, and determining whether or not to enable the plurality of memory blocks for a subsequent write operation in response to a result of the comparison.

13 Claims, 3 Drawing Sheets

SEMICONDUCTOR MEMORY SYSTEM AND METHOD FOR DRIVING THE SAME

CROSS-REFERENCE TO RELATED APPLICATIONS

The present application claims priority of Korean Patent Application No. 10-2011-0040803, filed on Apr. 29, 2011, which is incorporated herein by reference in its entirety.

BACKGROUND

1. Field

Exemplary embodiments of the present invention relate to semiconductor design technology, and more particularly, to a semiconductor memory device capable of measuring a deterioration degree of a memory block and managing the same.

2. Description of the Related Art

In general, semiconductor memory devices may be divided into volatile memory devices such as DRAM (Dynamic Random Access Memory) and SRAM (Static Random Access Memory) and nonvolatile memory devices such as PROM (Programmable Read Only Memory), EPROM (Erasable PROM), EEPROM (Electrically EPROM), and a flash memory device. The main difference between the volatile memory device and the nonvolatile memory device is whether or not data stored in memory cells are maintained after a certain time passes. In other words, data stored in memory cells of the volatile memory device may not be maintained after a predetermined time passes, but data stored in memory cells of the nonvolatile memory device may be maintained even after a predetermined time passes. Therefore, the volatile memory device performs a refresh operation to maintain data, while the nonvolatile memory device maintains data even without the refresh operation. Such a characteristic of the nonvolatile memory device is suitable for low power consumption and high integration of system. Therefore, the nonvolatile memory device is widely used as a storage medium of portable devices.

Among the nonvolatile memory devices, a flash memory device performs a programming operation and an erasing operation and stores data in a memory cell through such operations. The programming operation refers to an operation of storing electrons in floating gates of transistors composing a memory cell, and the erasing operation refers to an operation of discharging the electrons stored in the floating gates to a substrate. The flash memory device stores data of '0' or '1' in a memory cell through such operations. During a read operation, the flash memory device detects the amount of electrons stored in the floating gates and determines the data of '0' or '1' based on the detection result.

Meanwhile, the flash memory device performs a programming operation for new data after performing an erasing operation on a memory cell, in order to update data stored in the memory cell with the new data. Such a programming operation may not be uniformly performed on all memory cells provided in the flash memory device, but limited to specific memory cells. If the programming operation is frequently performed on specific memory cells, performance of the memory cells may deteriorate more, thereby reducing the performance of the memory device. Therefore, there is demand for technology which manages deterioration to stably maintain the performance of the semiconductor memory device for a longer period of time.

SUMMARY

An embodiment of the present invention is directed to a semiconductor memory device capable of measuring a deterioration degree of each memory block and managing the memory block by using an erase voltage corresponding to the memory block.

In accordance with an embodiment of the present invention, a method for driving a semiconductor memory device includes: controlling a plurality of erase voltages for a plurality of memory blocks, respectively; comparing the plurality of controlled erase voltages; and determining whether or not to enable the plurality of memory blocks for a subsequent write operation in response to a result of comparison.

In accordance with another embodiment of the present invention, a semiconductor memory system includes: a semiconductor memory device configured to control a plurality of erase voltages for a plurality of memory blocks, respectively, and enable the plurality of memory blocks for a subsequent write operation in response to a plurality of enable control signals; and a main control circuit configured to output the plurality of enable control signals for controlling the plurality of memory blocks in response to a plurality of final erase voltages.

The semiconductor memory device in accordance with the embodiment of the present invention detects an erase voltage corresponding to each memory block, analyzes the erase voltage, and enables a memory block which is less deteriorated. Therefore, the deterioration degrees of all memory blocks provided in the semiconductor memory device may be uniform.

DETAILED DESCRIPTION

Figure 1:
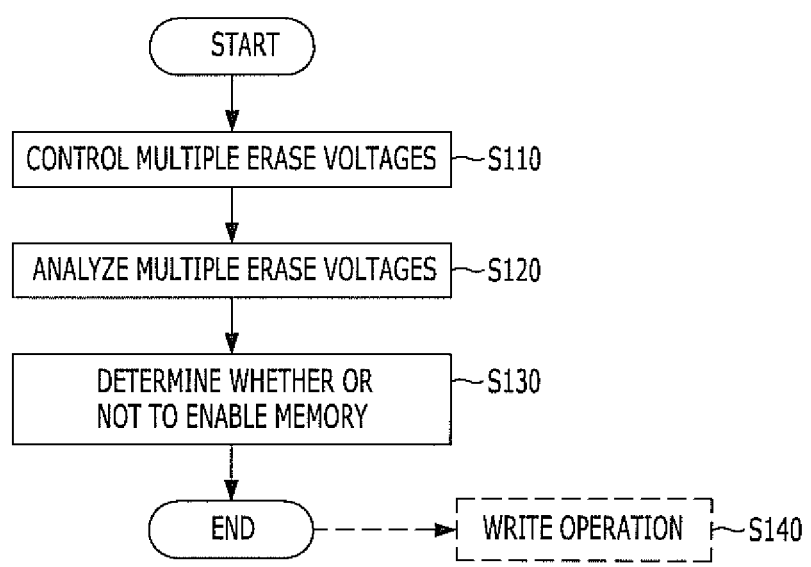
FIG. 1 is a flow chart explaining a method for driving a semiconductor memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a flow chart explaining a method for driving a semiconductor memory device in accordance with an embodiment of the present invention.

Referring to FIG. 1, the method for driving a semiconductor memory device includes: controlling a plurality of erase voltages at step S110; analyzing the plurality of erase voltages at step S120; and determining whether or not to enable a memory block at step S130 (for example, make eligible for subsequent write operation).

Hereafter, the method for driving a semiconductor memory device will be described in detail.

At the step S110, the plurality of erase voltages corresponding to the plurality of memory blocks, respectively, are controlled. This operation will be described in detail with reference to FIG. 2. Each of the erase voltages has a voltage level capable of erasing all memory cells provided in a corresponding memory block.

At the step S120, the plurality of erase voltages controlled at the step S110 are analyzed. In other words, the plurality of erase voltages controlled at step S110 are compared with each other, and the comparison results are detected to analyze the plurality of erase voltages. Here, the erase voltages are controlled to be progressively higher than a predetermined initial voltage level, depending on the states of the memory blocks. At the step S120, an erase voltage having the highest level among the plurality of erase voltages corresponding to the respective memory blocks is detected.

At the step S130, it is determined whether or not to enable a memory block corresponding to the detected erase voltage. Although will be described in detail, the erase voltage detected at the step S120 is an erase voltage having the highest voltage level among the erase voltages corresponding to the respective blocks. The memory block corresponding to the detected erase voltage is disabled, and the other memory blocks are enabled.

In the memory blocks enabled through the series of above-described operations, among the plurality of memory blocks, a variety of operations including a write operation may be performed at step S140.

Figure 2:
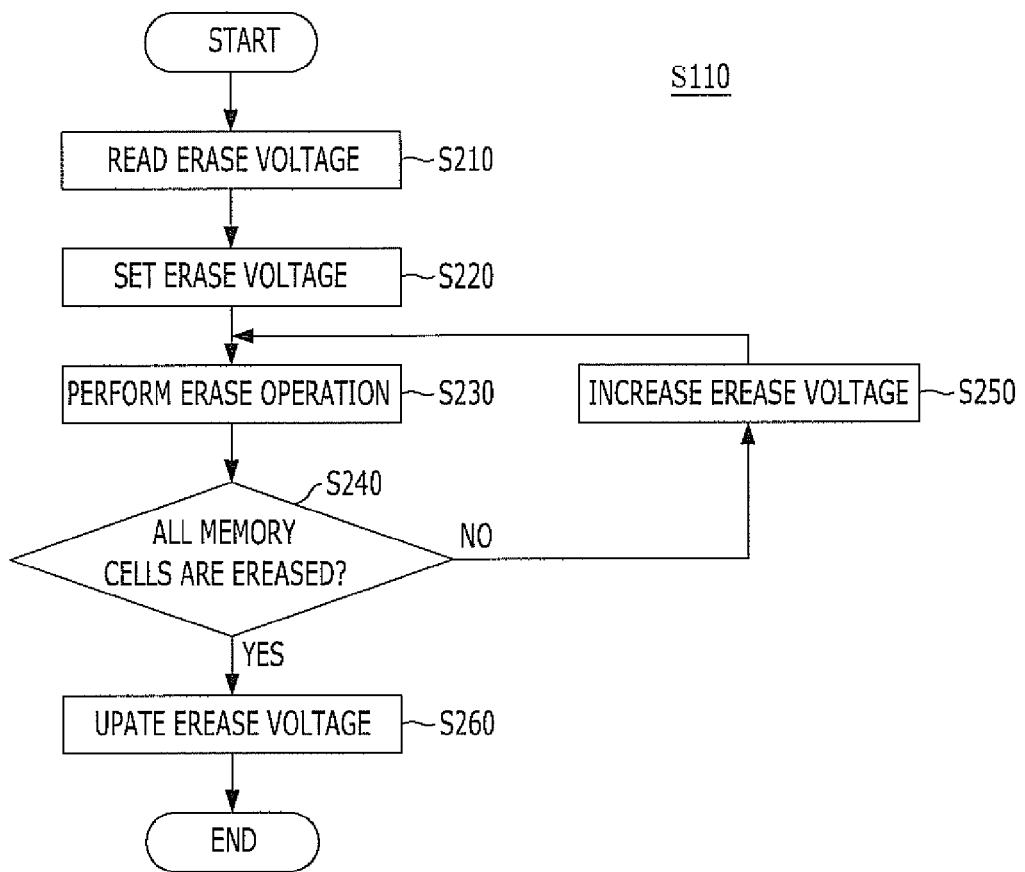
FIG. 2 is a flow chart explaining a step of controlling a plurality of erase voltages in FIG. 1.

FIG. 2 is a flow chart explaining the step S110 of controlling the plurality of erase voltages in FIG. 1. FIG. 2 shows the operation of one memory block among the plurality of memory blocks, for convenience of explanation.

Referring to FIG. 2, the step 110 of controlling the erase voltages includes: reading an erase voltage at step S210; setting the erase voltage at step S220; performing an erase operation at step S230; determining whether all memory cells are erased or not at step S240; increasing the erase voltage at step S250; and updating the erase voltage S260.

Hereafter, the process of controlling the erase voltages will be described in detail.

At the step S210, an initial erase voltage corresponding to one memory block among the plurality of memory blocks is read. The initial read erase voltage is stored in a predetermined storage circuit and set as an erase voltage at the step S220. At the step S230, an erase operation is performed on the memory block based on the set erase voltage. At the step S240, it is determined whether all memory cells provided in the corresponding memory block were erased or not. When it is determined at the step S240 that all the memory cells were erased, the step S260 is performed. Otherwise, when it is determined that any one of all the memory cells was not erased, the erase voltage is increased at the step S250. After the step S250, the process returns to the step S230. At this time, an erase operation is performed by using the increased erase voltage, at the step S230.

Meanwhile, at the step S260, the erase voltage increased at the step S250 is updated as a new erase voltage. At this time, the new erase voltage may be stored in a specific memory cell of the corresponding memory block or stored in a main control circuit, for example, a main control unit (MCU). As such, the semiconductor memory device controls the erase voltages through the series of operations, and the series of operations are performed in all the memory blocks.

The semiconductor memory device in accordance with the embodiment of the present invention may compare the erase voltages controlled in such a manner and disable a memory block having the highest level of erase voltage among the plurality of memory blocks. That is, whether or not to enable a memory block is decided by the erase voltage of the corresponding memory block.

Figure 3:
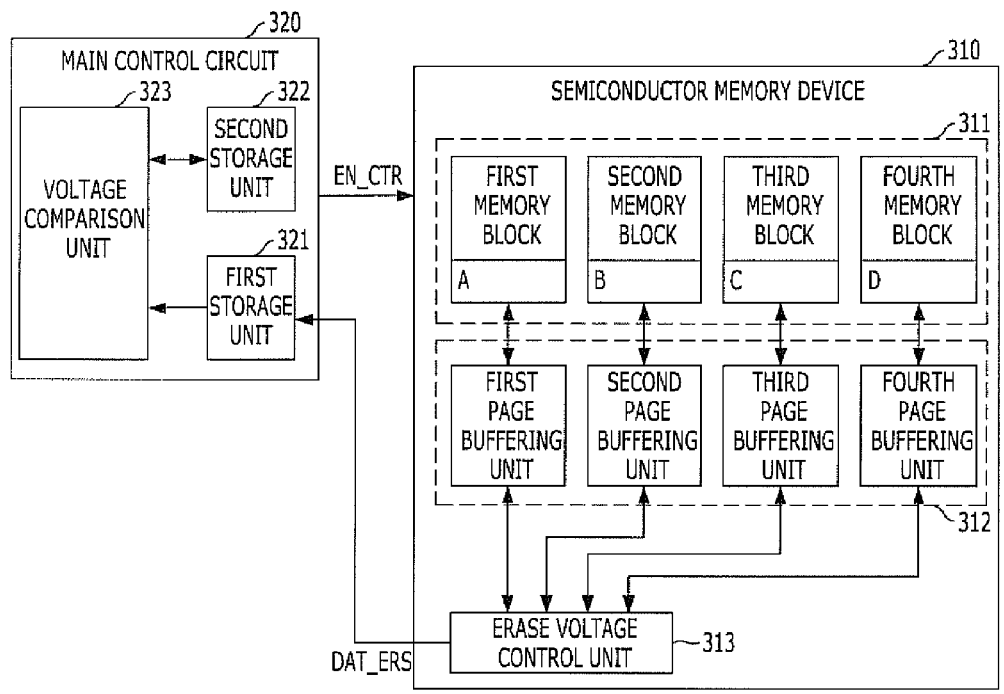
FIG. 3 is a block diagram explaining a semiconductor memory system in accordance with the first embodiment of the present invention.

FIG. 3 is a block diagram explaining a semiconductor memory system in accordance with a first embodiment of the present invention.

Referring to FIG. 3, the semiconductor memory system includes a semiconductor memory device 310 and a main control circuit 320. For convenience of explanation, FIG. 3 shows an example where erase voltages are stored in the semiconductor memory device 310.

The semiconductor memory device 310 is configured to control a plurality of erase voltages corresponding to a plurality of memory blocks 311, respectively, and enable the plurality of memory blocks 311 in response to an enable control signal EN_CTR. The semiconductor memory device 310 may include first to fourth memory blocks 311, first to fourth page buffering units 312, and an erase voltage control unit 313.

Each of the first to fourth memory blocks 311 includes a plurality of memory cells forming a page and a string, and erase voltages of the first to fourth memory blocks 311, respectively, are stored in specific memory cells A to D among the plurality of memory cells. Then, the first to fourth page buffering units 312 read the erase voltages stored in the first to fourth memory blocks 311 corresponding to the respective page buffering units, and the read erase voltages are transmitted to the erase voltage control unit 313. The plurality of erase voltages which are finally controlled by the erase voltage control unit 313 are stored in the specific memory cells A to D, respectively. Hereafter, the finally-controlled erase voltages are referred to as final erase voltages.

The erase voltage control unit 313 is configured to control the erase voltages transmitted through the first to fourth page buffering units 312 and corresponding to the first to fourth memory blocks 311, respectively, and generate a plurality of final erase voltages. That is, the erase voltage control unit 313 performs an operation corresponding to the step S250.

Meanwhile, the main control circuit 320 is configured to receive the plurality of final erase voltages from the semiconductor memory device 310 and generate an enable control signal EN_CTR for controlling a plurality of memory block in response to the plurality of final erase voltages. The main control circuit 320 includes a first storage unit 321, a second storage unit 322, and a voltage comparison unit 323. For reference, the plurality of final erase voltages may be converted into data corresponding to the respective values and provided to the main control circuit 320 from the semiconductor memory device 310 in series or parallel. In this embodiment, the final erase voltages are shown to be provided in series from the erase voltage control unit 313 as an example.

The first storage unit 321 is configured to store data DAT_ERS provided from the erase voltage control unit 313. The second storage unit 322 is configured to store data corresponding to a predetermined initial erase voltage. The second storage unit 322 is configured to update the data and store the updated data, based on a comparison result of the voltage comparison unit 323. The voltage comparison unit 323 is configured to compare an output voltage of the first storage unit 321 with an output voltage of the second storage unit 322 and transmit data to be updated to the second storage unit 322 based on the comparison result.

Hereafter, the circuit operation of the semiconductor memory system of FIG. 3 will be described. For convenience of explanation, the operation described in FIG. 2 is omitted here.

Through the operation of FIG. 2, the plurality of final erase voltages are stored in the specific memory cells A to D of the first to fourth memory blocks 311, respectively, and the erase voltage control unit 313 provides the plurality of final erase voltages corresponding to the first to fourth memory blocks 311, respectively, to the first storage unit 321 of the main control circuit 320.

For example, the plurality of final erase voltages stored in the specific memory cells A to D, respectively, may be 19V, 20V, 19V, and 18V (A=19V, B=20V, C=19V, D=18V) and the initial voltage stored in the second storage unit 322 may be set to 18V.

First, the first storage unit 321 receives 19V which is the final erase voltage of the memory cell A from the semiconductor memory device, and the voltage comparison unit 323 compares 19V with the initial voltage of 18V. At this time, since the final erase voltage of the memory cell A is higher, the second storage unit 322 updates the initial voltage of 18V with 19V. Next, the first storage unit 321 receives 20V which is the final erase voltage of the memory cell B, and the voltage stored in the second storage unit 322 is updated with 20V through the above-described operation. Meanwhile, since the final erase voltages of the memory cells C and D are smaller than the voltage of 20V stored in the second storage unit 322, the second storage unit 322 maintains 20V.

Subsequently, the main control circuit 320 generates an enable control signal EN_CTR corresponding to 20V stored in the second storage unit 322. The semiconductor memory device 310 disables the second memory block corresponding to 20V among the first to fourth memory blocks 311 and enables the other first, third, and fourth memory blocks, in response to the enable control signal EN_CTR for, for example, subsequent write operation on the enabled memory blocks.

The main control circuit 320 in accordance with the embodiment of the present invention may detect the highest final erase voltage among the final erase voltages of the first to fourth memory blocks 311 and disable a memory block corresponding to the highest final erase voltage. This means that the memory blocks corresponding to the final erase voltages having relatively low voltages are used at first. As a result, all the memory blocks may be uniformly used.

In accordance with the embodiments of the present invention, the deterioration degrees of all the memory blocks provided in the semiconductor memory device may be uniform to increase a lifetime period capable of using the semiconductor memory device stably.

While the present invention has been described with respect to the specific embodiments, it will be apparent to those skilled in the art that various changes and modifications may be made without departing from the spirit and scope of the invention as defined in the following claims.

What is claimed is:

1. A method for driving a semiconductor memory device, comprising:
controlling a plurality of erase voltages corresponding to a plurality of memory blocks, respectively;
comparing the plurality of controlled erase voltages with each other, wherein the comparing of the controlled erase voltages comprises detecting the erase voltage having the highest voltage level among the plurality of erase voltages; and
determining whether or not to enable the plurality of memory blocks for a subsequent write operation in response to a result of the comparison.

2. The method of claim 1, further comprising performing a write operation on an enabled one of the memory blocks for the subsequent write operation.

3. The method of claim 1, wherein the controlling of each of the plurality of erase voltages comprises:
reading an initial erase voltage for the corresponding memory block as the erase voltage;
controlling a voltage level of the erase voltage, while performing an erase operation on the corresponding memory block with the erase voltage; and
updating the erase voltage depending on a result of the controlling of the voltage level of the erase voltage.

4. The method of claim 1, wherein the comparing of the controlled erase voltages comprises detecting the erase voltage having the highest voltage level among the plurality of erase voltages.

5. The method of claim 1, wherein the memory block corresponding to the erase voltage having the highest voltage level among the plurality of erase voltages is disabled in the determining of whether or not to enable the plurality of memory blocks for subsequent write operation.

6. A semiconductor memory system comprising:
a semiconductor memory device configured to generate a plurality of final erase voltages by controlling a plurality of erase voltages corresponding to a plurality of memory blocks, respectively, and enable the plurality of memory blocks for a subsequent write operation in response to a plurality of enable control signals; and
a main control circuit configured to receive the plurality of final erase voltages from the semiconductor memory device and output the plurality of enable control signals for controlling the plurality of memory blocks in response to the plurality of final erase voltages.

7. The semiconductor memory system of claim 6, wherein the semiconductor memory device comprises:
a plurality of voltage storage units configured to store the plurality of erase voltages, respectively; and
an erase voltage control unit configured to generate the plurality of final erase voltages by controlling the plurality of erase voltages.

8. The semiconductor memory system of claim 7, wherein the erase voltage control unit provides the plurality of final erase voltages to the main control circuit.

9. The semiconductor memory system of claim 7, wherein the semiconductor memory device further comprises a plurality of page buffering units configured to read the plurality of erase voltages for the respective memory blocks, transmit the read erase voltages to the erase voltage control unit, and store the plurality of final erase voltages generated by the erase voltage control unit in the respective voltage storage units.

10. The semiconductor memory system of claim 6, wherein the main control circuit comprises:
a first storage unit configured to store data corresponding to the plurality of final erase voltages;
a second storage unit configured to store data corresponding to an initial voltage and store updated data, wherein the updated data is determined in response to a comparison result; and
a voltage comparison unit configured to compare the data of the first storage unit with the data of the second storage unit to output the comparison result.

11. The semiconductor memory system of claim 6, wherein the enable control signals are activated in response to the final erase voltage having the highest voltage level among the plurality of final erase voltages.

12. The semiconductor memory system of claim 6, wherein the memory block corresponding to the final erase voltage having the highest voltage level among the plurality of final erase voltages is disabled.

13. A semiconductor memory system comprising:
- a semiconductor memory device comprising:
    - a plurality of memory blocks configured to be enabled for a subsequent write operation in response to a plurality of enable control signals;
    - a plurality of voltage storage units configured to store a plurality of erase voltages, respectively; and
    - an erase voltage control unit configured to generate a plurality of final erase voltages by controlling the plurality of erase voltages; and
- a main control circuit configured to receive the plurality of final erase voltages and output the plurality of enable control signals for controlling the plurality of memory blocks in response to the plurality of final erase voltages.

* * * * *